United States Patent [19]

Braun

[11] 4,408,165
[45] Oct. 4, 1983

[54] DIGITAL PHASE DETECTOR

[75] Inventor: Reinhold Braun, Stuttgart, Fed. Rep. of Germany

[73] Assignee: International Standard Electric Corporation, New York, N.Y.

[21] Appl. No.: 321,831

[22] Filed: Nov. 16, 1981

[51] Int. Cl.³ .................. H03D 13/00; H03K 5/26
[52] U.S. Cl. ......................... 328/134; 307/516; 307/527
[58] Field of Search .............. 307/514, 516, 527; 328/134

[56] References Cited

U.S. PATENT DOCUMENTS

| | | | |
|---|---|---|---|
| 3,200,340 | 8/1965 | Dunne | 328/134 |
| 3,308,387 | 3/1967 | Hackett | 307/527 |
| 3,404,230 | 10/1968 | Hailey et al. | 328/134 |
| 4,128,812 | 12/1978 | Pavlis | 328/134 |
| 4,309,662 | 1/1982 | Baudaux | 328/134 |

Primary Examiner—John S. Heyman
Attorney, Agent, or Firm—John T. O'Halloran; Robert P. Seitter

[57] ABSTRACT

The invention relates to a digital phase detector for use with a phase-locked loop (PLL) system, to which there is fed a reference signal and a comparison signal and which, in accordance with the phase difference transmits an output signal for controlling a voltage-controlled oscillator (VCO). In conventional types of phase detectors there exists the danger that subsequently to a failure or interruption of the reference signal, the phase detector in certain cases controls the phase difference, following the restarting, not to zero but to $2\pi$. In order to prevent this, the invention proposes the phase detector to be preceded by a correction circuit delaying the switching of the signals to the phase detector, following the restarting of the reference signal, in such a way that the trailing edge of the reference signal is applied to the phase detector either simultaneously with or with a time delay after the trailing edge of the comparison signal. In this way, independently of the phase difference, and subsequently to the restarting of the reference signal, it is safeguarded that the phase difference is controlled to zero.

7 Claims, 4 Drawing Figures

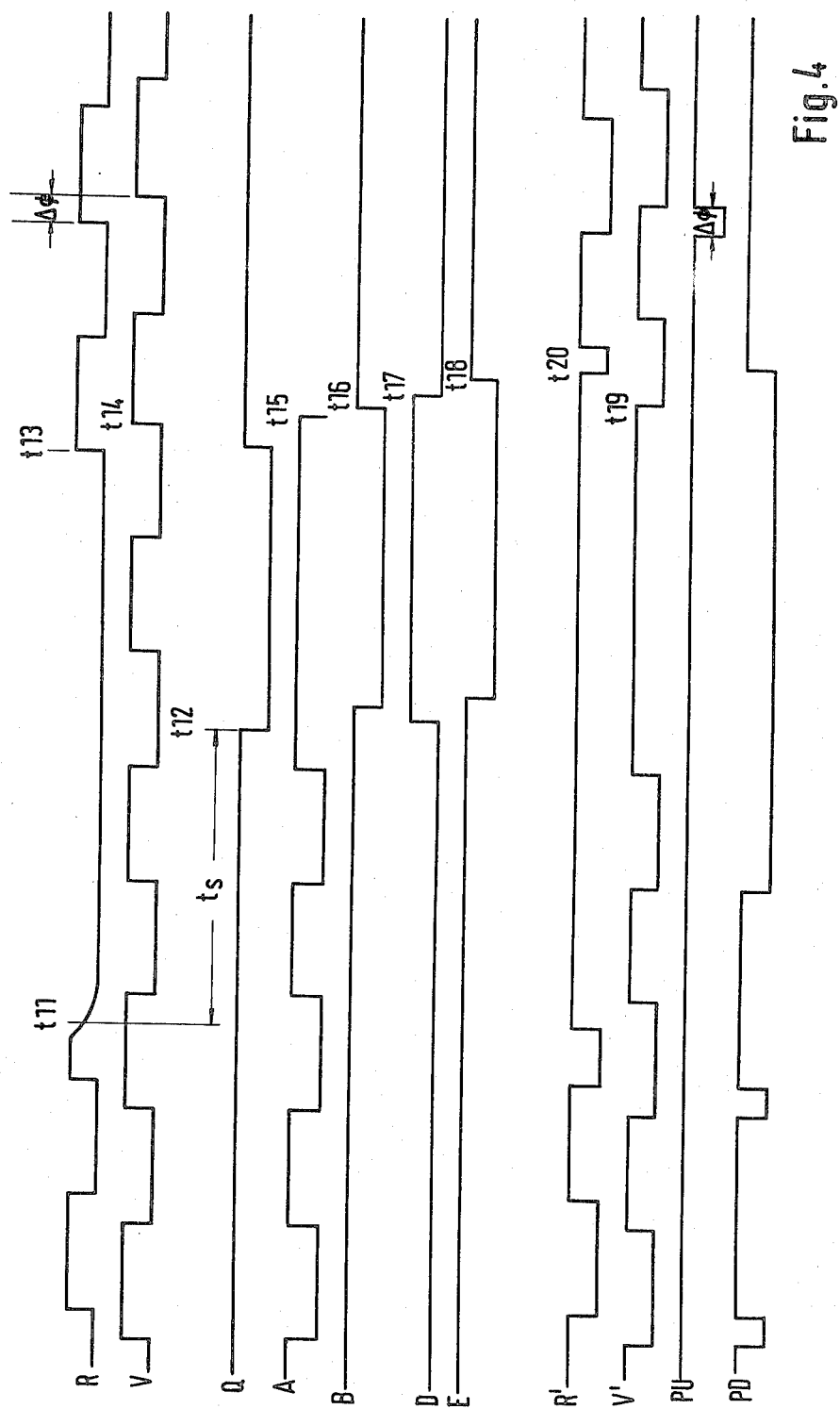

DIGITAL PHASE DETECTOR

FIELD OF THE INVENTION

The invention relates to a digital phase detector having two inputs and two outputs for a phase-locked-loop (PPL) system with a reference signal and a comparison signal, in which the reference signal is capable of being applied to the first input and in which the comparison signal is capable of being applied to the second input, and in which the first output delivers a first output signal whenever the reference signal, in its phase, leads the comparison signal, and the second output delivers a second output signal whenever the reference signal, in its phase, lags behind the comparison signal, with the pulse widths of these output signals each being in proportion to the value of the phase shift between the reference signal and the comparison signal.

Such a phase detector is preferably used with phase-locked-loop (PLL) systems for synchronizing, for example, the output signal of a voltage-controlled oscillator (VCO) as the comparison signal with a control signal as the reference signal. The phase detector compares the phase of the reference signal with the phase of the comparison signal. Quite depending on the phase difference there appears either at the one or the other output of the phase detector, an output signal whose pulse width is in proportion to the value of the phase difference. Via an amplifier and a filter, the output signal is fed to the oscillator as a control signal.

Conventional phase detectors of the type mentioned hereinbefore have a faulty behavior in the event of an interruption of the reference signal particularly when the phase of the restoring reference signal is in advance of the phase of the original reference signal. In such a case the phase is balanced to $2\pi$ instead of to zero. This faulty behavior occurs above all when the reference signal, prior to the interruption, is taken from a source other than the reference signal after the interruption. This may occur, for example, when a back-up reference generator is activated upon a loss of power to the primary reference signal generator.

SUMMARY OF THE INVENTION

It is the object of the invention to provide a digital phase detector of the type mentioned hereinbefore which, even when controlled by substituted reference signals of different phase, and following a signal interruption, adjusts the phase to zero.

According to the invention this object is achieved in that the inputs of the phase detector are preceded by a correction circuit having two inputs and two outputs, with the outputs of the correction circuit being connected to the inputs of the phase detector, and with both the reference signal and the comparison signal capable of being applied to the inputs of the correction circuit, and in that the correction circuit, following an interruption of the reference signal, performs the switching of its inputs to its outputs in such a way that the trailing edges of both the reference signal and the comparison signal are switched simultaneously or in that the trailing edge of the reference signal is switched after the trailing edge of the comparison signal.

In this way both the reference signal and the comparison signal, independently of the phase relation of the control signal, before and after the interruption, are always applied in the predetermined order of succession to the digital phase detector in order thus to make sure that the phase adjustment is carried out at zero and not at $2\pi$.

In order to achieve this switching of the reference and the comparison signal to the inputs of the phase detector at the proper time it is proposed, according to one type of embodiment, for the correction circuit to comprise two switching gates whose outputs are connected to the outputs of the correction circuit, that each switching gate comprises two inputs of which the one is connected to the associated input of the correction circuit, and of which the other one is capable of being controlled via a logic circuit performing either the simultaneous or the successive switching of the switching gates subsequently to a failure and upon the effected recovery of the reference signal.

In order to enable this logic circuit to determine in a simple way the beginning and the end of the interruption of the reference signal it is proposed in accordance with a further embodiment that the logic circuit comprises a monostable circuit which is capable of being controlled by the leading edges of the reference signal and which remains in the turn-on state as long as the reference signal is applied and which, upon failure of the reference signal, and after the lapse of the signal time, initiates the blocking of the switching gates.

According to one type of embodiment, the controlling of the switching gates in the correction circuit is accomplished in that the logic circuit comprises a trigger circuit which is brought into its operating position when the monostable circuit is in its turned-on state, that the one output of the trigger circuit, via an inverter, is connected to the second input of the switching gate which is controlled by the reference signal, that the other output of the trigger circuit is connected to the second input of the switching gate as controlled by the comparison signal, and that the trigger circuit, via a gate circuit, is capable of being controlled into the operating position which is capable of being controlled by the output signal of the monostable circuit and by the comparison signal.

The time delay in the switching of the reference signal is safeguarded, in accordance with a further embodiment, in that the gate circuit resets the trigger circuit whenever the monostable circuit is in its turned-on state, and when the comparison signal is applied, and in that a capacitor is arranged in parallel with the second input of the switching gate as controlled by the reference signal.

BRIEF DESCRIPTION OF THE DRAWING

The invention will now be explained in greater detail with reference to FIGS. 1 to 4 of the accompanying drawings, in which:

FIG. 4 shows the signal diagrams relating to the phase detector according to the invention, comprising a correction circuit.

DETAILED DESCRIPTION OF THE INVENTION

Figure 1:
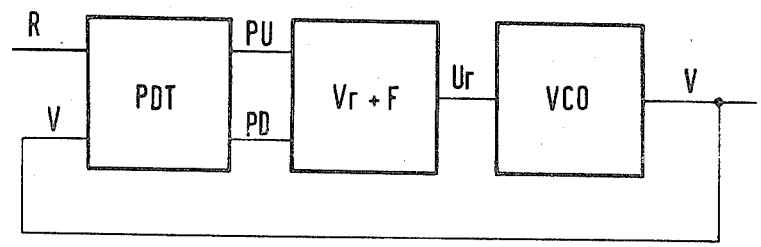
FIG. 1 shows the block diagram of a PLL circuit comprising a phase detector.

In a PLL system as shown in FIG. 1, the frequency and the phase of a voltage-controlled oscillator VCO are adjusted to both the frequency and the phase of a reference signal. The reference signal R is applied to the one input of a digital phase detector PDT while the output signal of the oscillator VCO is applied as a comparison signal V to the other input of the phase detector PDT. The phase detector PDT is designed in such a way that an output signal appears at the output PU whenever the reference signal R, in its phase, is in advance of the phase of the comparison signal V, and that an output signal appears at the output PD whenever the reference signal R, in its phase, lags the phase of the comparison signal V. Relative thereto, the output signal has a pulse width which is in proportion to the value of the phase difference and, via the amplifier Vr and a low-pass filter F, is applied as a control signal Ur to the control input of the voltage-controlled oscillator VCO.

The phase detector PDT consists of two symmetrical halves. The output PU is associated with the input for the reference signal R, and the output PD is associated with the input for the comparison signal V. From the neutral normal position in which the outputs PU and PD are in the H-state, i.e. inactive, the associated output in response to a trailing edge of the associated signal, is switched to the L-state, i.e. activated. If an output is already in the activated state then further trailing edges at the associated input will no longer have any influence upon the state of the output. If an output is activated, and when a trailing edge appears at the output of the non-activated half, then the activated output is again switched to the inactive state (H-state) and the phase detector reassumes its neutral normal position (PU=H, PD=H). When both outputs are inactive (H-state), and when trailing edges appear simultaneously at both inputs, then merely short voltage pulses will appear at the two outputs PU and PD which compensate each other in their effects.

In the following, by starting out from the normal position of the phase detector PDT with PU=H and PD=H, the first trailing edge activating the associated output (L-state) is referred to as the early edge and that particular trailing edge which effects the switching back of the output to the inactive state (H-state), is referred to as the late edge. In the case of an activated (L-state) output PU, the phase of the voltage-controlled oscillator VCO is delayed in a PLL circuit, with this phase, however, being accelerated in the case of an activated output PD.

Figure 3:
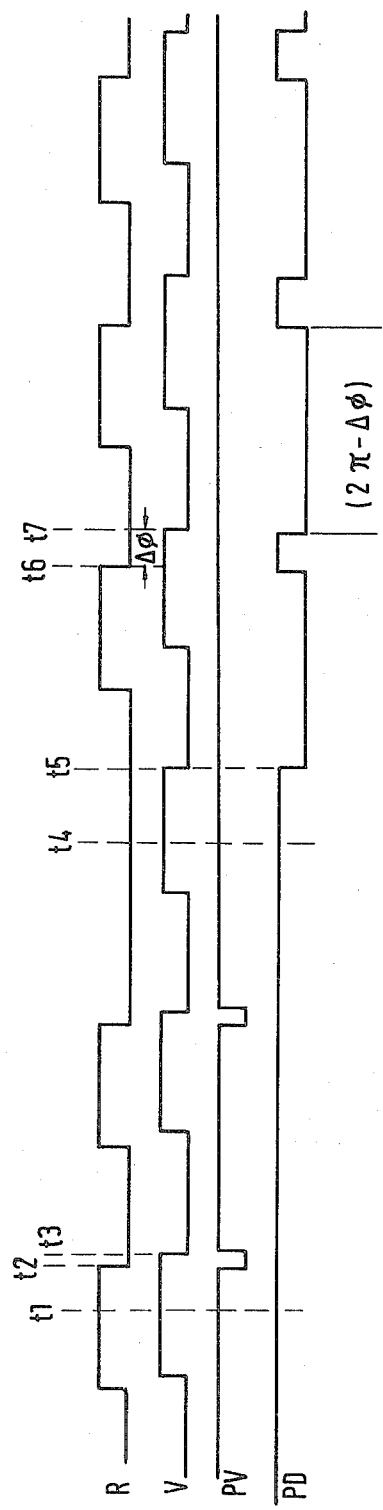
FIG. 3 shows the signal diagrams of the conventional type of phase detector.

A failure or an interruption of the reference signal R has to be expected in the operational case. Such interruption may also be caused by a switching from a first to a second reference signal source. Both the failure and the interruption of the reference signal must be recognized. Owing to module tolerances or the like, the reference signal appearing after the interruption may show to have a phase shift in either the positive or the negative direction compared with the reference signal appearing prior to the interruption or the failure. When the phase of the reference signal appearing after the interruption is in advance of the phase of the reference signal appearing prior to the interruption, the phase adjustment is carried out in the wrong direction, as can be seen from the signal diagrams shown in FIG. 3.

At the time position t1 there exists the neutral normal position (PU=H, PD=H) of the phase detector PDT. The trailing edge of the reference signal R as appearing at the time position t2, therefore, acts as an early edge and activates the output PU (L-state). At the time position t3, the trailing edge of the comparison signal V acts as a late edge and switches the output PU again into the inactive state (H-state). The pulse width of the output signal at the output PU is determined by the time difference t3−t2. In the ideal case, t3−t2=0, i.e. the reference signal R is in phase with the comparison signal V. Also, at the time position t4, the two outputs PU and PD are inactive (H-state). Consequently, the trailing edge of the comparison signal V acts as an early edge at the time position t5 and activates the output PD (L-state). For the first time after the interruption of the reference signal R, a trailing edge of this reference signal R appears at the time position t6. Considering that, at this particular time position t6, the output PD is activated (L-state), the trailing edge of the reference signal R acts as a late edge and switches the output PD into the inactive state (H-state). In this way, the normal position (PU=H, PD=H) of the phase detector PDT is reestablished. At the time position t7, therefore, the trailing edge of the comparison signal V is evaluated again as an early edge even when the time or phase difference $\Delta\phi$ between t7 and t6 only amounts to a small fraction of a signal period. The output signal at the output PD, therefore, has a pulse width which is determined by the expression $(2\pi - \Delta\phi)$. The phase error $\Delta\phi$ is increased to the value $2\pi$.

Accordingly, the mode of operation of the conventional phase detector PDT may be described as follows: In the absence of the trailing edges of the reference signal R it is detected by the phase detector PDT that the trailing edges of the comparison signal V appear in a much too rapid succession. Therefore, the trailing edges of the comparison signal V are subjected to a time delay until the synchronism with the trailing edges of the reference signal R is reestablished. In case the trailing edges of the restarting reference signal R show to lag the trailing edges of the comparison signal V by a phase angle $\Delta\phi$ (which only amounts to a fraction of a signal period $2\pi$), the time delay of the trailing edges of the comparison signal V leads to a reduction of the phase angle towards the value zero. However, if the trailing edges of the restarting reference signal R show to be in advance of the trailing edges of the comparison signal V by a phase angle $\Delta\phi$, this phase angle is increased to the value $2\pi$, because only in the case of this phase angle, the trailing edges of both the reference signal R and of the comparison signal V again assume a coinciding phase relationship. Therefore, in the case of leading trailing edges of the reference signal R, the locking behavior of the phase detector PDT is in need of a correction.

Figure 2:
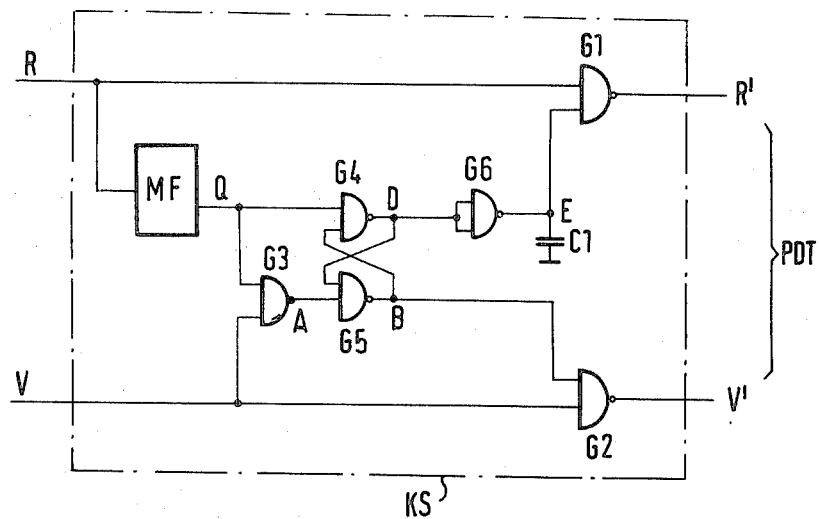
FIG. 2 shows a block diagram relating to a correction circuit which, according to the invention, precedes the phase detector.

For this purpose, there is provided the correction circuit KS as shown in FIG. 2, which is arranged to precede the conventional phase detector PDT. This correction circuit KS as two outputs which are connected to the two inputs of the phase detector PDT. Now, the reference signal R is applied to the one input of the correction circuit KS while the comparison signal V is applied to the second input of the correction circuit KS. By this correction circuit KS it is effected that in the event of a failure or interruption of the reference signal R both inputs of the phase detector PDT are brought into the inactive state (H-state) and that subsequently to the restarting of the reference signal R, the trailing edge of the comparison signal V is first applied to the input of the phase detector PDT which is associated with the comparison signal V, with the trailing edge of the reference signal R being applied only thereafter to the input of the phase detector PDT associated with the reference signal R. In the course of this, the trailing edge of the comparison signal V remains ineffective, because at this time position, the output PD of the phase detector PDT has already been activated (PD=L). Consequently, the trailing edge of the reference signal R acts as a late edge and causes the phase detector PDT to be brought into its normal position (PD=H, PU=H). Further trailing edges of both the reference signal R and the comparison signal V appear only after the next signal period. Since, at this time position, the phase detector PDT has assumed its normal position (PD=H, PU=H), the phase is now properly adjusted.

The mode of operation of the correction circuit KS according to the invention will now be explained in greater detail with reference to the circuit diagram of FIG. 2 and the signal diagrams of FIG. 4. With the aid of a monostable circuit MF which is capable of being retriggered, it is supervised whether the reference signal R is present. Hence, the correction circuit is always regulated by the monostable circuit. As long as leading edges of the reference signal R appear at the input of the correction circuit KS which is associated with the reference signal R, the output Q of the monostable circuit MF remains in its H-state. At the same time, the trigger circuit consisting of the gates G4 and G5, assumes its operating position (D=L, B=H), because the potential corresponding to the H-state is applied to the point Q, and the potential corresponding to the L-state, appears periodically at the point A. Via an inverter formed by the gate G6, the one output of the trigger circuit is led to the second input of the switching gate G1 as associated with the reference signal R, while the other output is directly connected to the second input of the switching gate G2 as associated with the comparison signal V. In this operating position of the trigger circuit the two switching gates G1 and G2 for both the reference signal R and the comparison signal V are conductive, because the points E and B conduct a potential corresponding to the H-state.

When the reference signal R fails at the time position t11 then, after the lapse of its period of time ts, the monostable circuit MF is triggered into the state in which the output Q assumes the L-state. This is the case at the time position t12. Due to the variation of the potential at point Q, also the trigger circuit is retriggered into the resting position (B=L, D=H). In consequence of this, the switching gates G1 and G2 are blocked. The signals R' and V' as applied to the phase detector PDT are in the H-state. At the time position t13 there follows the first leading edge of the restarting reference signal R, so that now the monostable circuit MF reassumes the position with the H-state at the output Q. When point Q assumes the H-state and in the presence of the comparison signal V, a trailing edge will appear at point A at the time position t15. Since, at this particular time position, a potential corresponding to the H-state of the point Q, is applied to the input of the gate G4, the trigger circuit is reset to its operating position by the trailing edge at point A.

At first, a leading edge appears at point B at the time position T16 and, one gate cylce later, a trailing edge appears at point D at the time position t17. Finally, again one gate cycle later, a leading edge appears at the input of the switching gate G1 (point E) at the time position t18. With the aid of the capacitor C1 which is connected in parallel with the input, the last-mentioned gate cycle can be made relatively long. In this order of sequence of the level transitions it is safeguarded that the potential corresponding to the H-state, is first applied to point B of the switching gate G2 (time position t16), and only two gate cycles later (time position t18) to point E of the switching gate G1. On the other hand, it is also safeguarded that the reference signal R is applied at these time positions t16 and t18 to the switching gate G1, and the comparison signal V to the switching gate G2. As will be recalled, these two switching states at the switching gates G1 and G2 were the prerequisite for the trailing edge to appear at all at point A and at the time position t15. This trailing edge at point A, as is well known, had brought the trigger circuit into its operating position. In this way there is achieved the goal that after the restarting of the reference signal R, at first the trailing edge of the comparison signal V is fed to the phase detector PDT and only thereafter the trailing edge of the reference signal R, with this being accomplished independently of the phase relationship between the reference signal R and the comparison signal V.

In the adjusted state, the correction circuit KS causes no inaccuracies with respect to the phase relationship, because both signals R and V are switched via switching gates G1 and G2 of the same time. Owing to the internal cycles of the phase detector PDT it is sufficient for the two active trailing edges of the comparison signal V' and of the reference signal R' to be applied simultaneously at the time positions t19 and t20, respectively. In fact, in the output state PU=H and PD=L, the trailing edge of the reference signal R' is evaluated as a late edge even when it appears approximately one gate cycle ahead of the active trailing edge of the comparison signal V'.

Of course, also the input of the correction circuit KS which is associated with the comparison signal V can be supervised in a similar way.

I claim:

1. In a digital phase detector having two inputs and two outputs for a phase-locked-loop (PLL) system with a reference signal and a comparison signal, in which the reference signal is capable of being applied to the first input and in which the comparison signal is capable of being applied to the second input, and in which the first output delivers a first output signal whenever the reference signal, in its phase, leads the comparison signal, and the second output delivers a second output signal whenever the reference signal, in its phase, lags behind the comparison signal, with the pulse widths of these output signals each being in proportion to the value of the phase shift between the reference signal and the comparison signal, the improvement comprising that the inputs of said phase detector (PDT) are preceded by a correction circuit (KS) having two inputs and two outputs, with the outputs of said correction circuit (KS) being connected to the inputs of said phase detector (PDT), with both said reference signal (R) and said comparison signal (V) capable of being applied to the inputs of said correction circuit (KS), and that said correction circuit (KS), following an interruption of said reference signal (R), includes means for switching its inputs to its outputs such that the trailing edges of both said reference signal (R) and said comparison signal (V) are switched through simultaneously, or that the trailing edge of said reference signal (R) is switched through subsequently to the trailing edge of said comparison signal (V).

2. A phase detector as claimed in claim 1, wherein said correction circuit (KS) comprises two switching gates (G1, G2) whose outputs are connected to the outputs of said correction circuit (KS), that each of said switching gates (G1, G2) comprises two inputs of which the one is connected to the associated input of said correction circuit (KS), and of which the other one is capable of being controlled via said switching means which includes a logic circuit performing either the simultaneous or successive switching of said switching gates (G1, G2) subsequently to a failure of said reference signal (R).

3. A phase detector as claimed in claim 2, wherein said logic circuit comprises a monostable circuit (MF) which is capable of being controlled by the leading edges of said reference signal (R) and remains in the turn-on state (Q=H) as long as said reference signal (R) is applied and which, upon failure of said reference signal (R), upon lapse of the time (ts), initiates the blocking of said switching gates (G1, G2).

4. A phase detector as claimed in either one of claims 2 or 3, wherein said logic circuit comprises a trigger circuit (G4, G5) which, in the resting state (Q=L) of said monostable circuit (MF), is brought into the resting position (D=H, B=L), that the one output (D) of said trigger circuit (G4, G5), via an inverter (G6) is connected to the second input of said switching gate (G1) as controlled by said reference signal (R), that the other output (B) of said trigger circuit (G4, G5) is connected to the second input of said switching gate (G2) as controlled by said comparison signal (V), and that said trigger circuit (G4, G5), via a gate circuit (G3), which is capable of being controlled by the output signal (Q) of said monostable circuit (MF) and by said comparison signal (V), is capable of being controlled into the operating position (D=L, B=H).

5. A phase detector as claimed in claim 4, wherein said gate circuit (G3) serves to reset said trigger circuit (G4, G5) to the operating position when said monostable circuit (MF) is in its turned-on state (Q=H) and when said comparison signal (V) is applied.

6. A phase detector as claimed in claim 4 wherein a capacitor (C) is arranged in parallel with the second input of said switching gate (G1) as controlled by said reference signal.

7. A phase detector as claimed in claim 5 wherein a capacitor (C) is arranged in parallel with the second input of said switching gate (G1) as controlled by said reference signal.

* * * * *